United States Patent [19]

Calhoun et al.

[11] Patent Number: 5,087,494
[45] Date of Patent: Feb. 11, 1992

[54] ELECTRICALLY CONDUCTIVE ADHESIVE TAPE

[75] Inventors: Clyde D. Calhoun; James G. Berg; David C. Koskenmaki; Robert M. Swinehart, all of St. Paul, Minn.

[73] Assignee: Minnesota Mining and Manufacturing Company, St. Paul, Minn.

[21] Appl. No.: 684,606

[22] Filed: Apr. 12, 1991

[51] Int. Cl.$^5$ .............................................. C09J 7/02
[52] U.S. Cl. ................................. 428/40; 428/148; 428/200; 428/204; 428/343; 428/349; 428/354; 428/356
[58] Field of Search ............ 428/40, 143, 148, 200, 428/204, 206, 208, 343, 349, 352, 354, 356

[56] References Cited

U.S. PATENT DOCUMENTS

| | | | |
|---|---|---|---|
| Re. 24,906 | 12/1960 | Ulrich | 206/59 |
| 3,301,741 | 1/1967 | Henrickson | 428/40 |
| 3,680,037 | 7/1972 | Nellis et al. | 339/61 M |
| 4,008,300 | 2/1977 | Penn | 264/104 |
| 4,113,981 | 9/1978 | Fujita et al. | 174/88 R |
| 4,448,837 | 5/1984 | Ikeda et al. | 428/215 |
| 4,546,037 | 10/1985 | King | 428/323 |
| 4,548,862 | 10/1985 | Hartman | 428/323 |
| 4,556,595 | 12/1985 | Ochi | 428/355 |
| 4,606,962 | 8/1986 | Reylek et al. | 428/148 |
| 4,680,226 | 7/1987 | Takeda | 428/327 |
| 4,729,809 | 3/1988 | Dery | 252/511 |
| 4,731,282 | 3/1988 | Tsukagoshi et al. | 428/220 |
| 4,735,847 | 4/1988 | Fujiwara et al. | 428/209 |
| 4,740,657 | 4/1988 | Tsukagoshi et al. | 174/88 R |
| 4,769,399 | 9/1988 | Schenz | 523/213 |
| 4,880,683 | 11/1989 | Stow | 428/200 |
| 5,008,139 | 4/1991 | Ochi | 428/40 |

FOREIGN PATENT DOCUMENTS 0330452 2/1989 European Pat. Off.
WO85/04980 11/1985 PCT Int'l Appl.

*Primary Examiner*—Jenna Davis
*Attorney, Agent, or Firm*—Gary L. Griswold; Walter N. Kirn; Darla P. Neaveill

[57] ABSTRACT

An adhesive tape has a flexible carrier web that has a low-adhesion face formed with a predetermined pattern of dimples, each of which contains a plurality of electrically conductive particles that can either be loose or bound together into clusters by a binder. An adhesive layer covers said face and deposited particles and can be a pressure-sensitive adhesive or a heat-activatable adhesive. When the adhesive layer is separated from the carrier web, it carries along the particles. When the particle-bearing adhesive layer is used to bond together two arrays of electrodes, facing pairs of the electrodes are electrically interconnected either by single particles or by clusters of the particles. When a binder is used to bind the electrically conductive particles into clusters, the binder can add to the strength of the adhesive bond between the electrode-bearing surfaces.

13 Claims, 3 Drawing Sheets

ELECTRICALLY CONDUCTIVE ADHESIVE TAPE

BACKGROUND OF THE INVENTION

1. Field of the Invention

The invention concerns an adhesive tape, the adhesive layer of which contains electrically conductive particles. The particles can afford electrical conductivity through the thickness of the adhesive layer while being laterally spaced so that the layer is electrically insulating in lateral directions; or the particles can form electrically conductive stripes that afford electrical conductivity both laterally and through the thickness of the adhesive layer.

2. Description of the Related Art

Modern electronic devices are becoming so small and delicate that it can be virtually impossible to interconnect electrodes of two such devices either mechanically or by soldering. It also may be necessary to dissipate heat and static electricity from such a device, e.g., from a semiconductor die or chip.

U.S. Pat. No. 4,113,981 (Fujita et al.) uses an adhesive layer for individually electrically interconnecting multiple pairs of arrayed electrodes. The adhesive layer includes spherical electrically conductive particles of slightly less thickness than the adhesive. When the adhesive layer is compressed between electrodes, individual particles bridge the electrodes. The particles are randomly distributed throughout the adhesive layer, but Fujita indicates that if the particles comprise less than 30% by volume of the layer, they will be laterally spaced so that the intervening adhesive will insulate against short circuiting between laterally adjacent electrodes.

In PCT Publ. No. WO 85/04980 dated Nov. 7, 1985 (Dery et al.), an adhesive layer is made electrically conductive by incorporating what Dery calls "conductive units" of electrically conductive particles. "Depending upon the size of the particles used, the conductive unit may be a single particle or a plurality of clustered particles" (sentence bridging pp. 8-9). "The particles have a tendency to form clusters during the mixing of the composition. These clusters are of sufficient size to permit conductivity through the layer of adhesive composition" (p. 10, lines 3-5).

Although not mentioned by Dery, the tendency of electrically conductive particles to cluster makes the adhesive layer laterally electrically conductive across the width of each cluster, so that adjacent electrodes could be short circuited by a cluster having greater breadth than the spacing between those electrodes.

Clustering can be minimized by employing electrically conductive particles that are substantially as large as the thickness of the adhesive layer, and locating the particles in preselected segments of the adhesive layer. Coassigned U.S. Pat. No. 4,606,962 (Reylek et al.) teaches, beginning at col. 2, line 39, three techniques for doing so. The electrically conductive particles of Reylek preferably are spherical, exceed the adhesive thickness, and are soft so that when the adhesive layer is compressed between two flat rigid plates, the particles are flattened, thus providing small, flat conductive areas at both surfaces of the adhesive layer. Instead, each of the particles may be an aggregate of tiny fused granules such as granules of a metal which is at least as deformable as substantially pure silver.

In coassigned EPO Pat. Appl. Publ. No. 0,330,452 dated Aug. 30, 1989 (Calhoun et al.), electrically conductive particles are individually transferred to the adhesive layer, but FIG. 4 shows that sometimes two or more particles are deposited together. The electrically conductive particles of Calhoun are equiax and have sufficient hardness to penetrate into electrodes to be connected. The use of the Calhoun adhesive layer to interconnect multiple pairs of arrayed electrodes would involve no danger of shortcircuiting provided that the total breadth of the largest number of particles that might be deposited at one position did not exceed the spacing between laterally adjacent electrodes.

Multiple electrodes to be interconnected typically are arrayed on a flat electrically insulative surface and protrude so slightly above that surface, e.g, from 15 to 150 μm, that the electrode bearing surface can be considered to be substantially flat. When an adhesive layer containing laterally spaced electrically conductive particles is employed to interconnect two such arrays, the adhesive can be squeezed into lateral spaces between adjacent electrodes, especially when the adhesive is flowable at the bonding temperature. The result of doing so is illustrated in U.S. Pat. No. 4,680,226 (Takeda). See also U.S. Pats. No. 4,731,282 and No. 4,740,657 (both Tsukagoshi et al.) and U.S. Pat. No. 4,735,847 (Fujiwara et al.). Any such lateral flow of the particles into the lateral spaces between electrodes can increase the danger of short circuiting of closely spaced electrodes.

Another problem is that to use an adhesive layer to interconnect tiny electrodes, it must contain a sufficient concentration of the electrically conductive particles or clusters of particles to ensure that at least one particle or chain of particles makes good electrical contact between every pair of electrodes. Because electrically conductive particles interfere with adhesion, there is a hazard that the particles might interfere with the ability of the adhesive layer to maintain a permanent bond, especially in uses involving wide variations in temperature and humidity. In some uses, even an occasional failure can be disastrous.

Coassigned U.S. Pat. No. 4,548,862 (Hartman) also uses an adhesive layer for interconnecting multiple pairs of electrodes, doing so with electrically conductive particles that are smaller than the thickness of the adhesive layer. While forming the adhesive layer, a magnetic field aligns the particles into a large number of discrete, laterally spaced chains extending through the thickness of the adhesive layer.

In the adhesive layer of U.S. Pat. No. 4,448,837 (Ikeda et al.), similar electrically conductive chains are formed of relatively coarse particles, and finer electrically conductive particles are dispersed near at least one surface of the adhesive layer.

In coassigned U.S. Pat. No. 4,546,037 (King), an adhesive layer contains electrically conductive particles that have been magnetically aligned to form nonintersecting stripes, each containing a continuous array of contacting electrically conductive particles to make each stripe electrically conductive over both its length and thickness. Such an electrically conductive tape can make individual electrical connections between two banks of electrodes which cannot be superimposed.

3. Other Prior Art

In U.S. Pat. No. 4,008,300 (Ponn), a slurry of electrically conductive particles is forced under pressure into parallel perforations that extend through a thin elastomeric sheet, thus forming resilient electrically conductive rods which bulge out beyond the ends of the perforations. Upon being clamped between flat surfaces, lateral forcible expansion of the individual rods puts them under pressure, thus assuring that each rod electrically interconnects facing pairs of electrical terminals on the two flat surfaces, e.g., terminals on printed circuit boards. Ponn does not use an adhesive and instead depends upon a mechanical clamp to maintain the electrical connections.

An electrical connector similar to that of Ponn is described in U.S. Pat. No. 3,680,037 (Nellis et al.). The element of the Nellis Patent that is comparable to Ponn's elastomeric sheet is called a "retainer sheet" or a "dielectric retainer" that can be a themosetting or thermoplastic resin.

SUMMARY OF THE INVENTION

The invention provides an adhesive tape containing electrically conductive particles by which multiple pairs of arrayed electrodes that are closely spaced can be reliably interconnected. The novel adhesive tape can be more economical than are many comparable tapes of the prior art, because it can provide such electrical interconnections at extraordinary low total particle loadings. Adhesive bonds formed by the novel tape can be substantially as strong as can be formed using a layer of the same adhesive that is free from electrically conductive particles.

Briefly, the novel electrically conductive adhesive tape comprises a flexible carrier web that has a low-adhesion face bearing an adhesive layer, which layer has substantially uniform thickness and a Lap Shear Value from aluminum (measured under ASTM D1002) of at least 0.2 MPa (preferably at least 1 MPa). The novel tape is formed with a plurality of spaced pockets, each containing a plurality of electrically conductive particles in contact with the adhesive layer which is otherwise substantially free from electrically conductive material. The adhesive layer can be separated from the carrier web to bond two substantially flat electrically conductive surfaces together, with particles of individual pockets bridging the adhesive layer to afford electrical interconnections between those surfaces. Preferably the particles of each pocket are cohered into clusters by an elastomeric binder that is in compression between the electrically conductive surfaces while the surrounding adhesive is in tension.

The term "substantially flat electrically conductive surface" includes any substantially flat surface that is electrically conductive, even when electrically conductive elements such as terminals or electrodes are slightly raised above the surface.

When the novel tape is to be used to interconnect facing arrays of electrodes, the pockets preferably are dimples of substantially equal size or they can be elongated grooves. Dimples can have a variety of shapes, e.g., hemispherical, pyramidal, conical, or cylindrical. Exceedingly small and closely spaced dimples can be formed in the low-adhesion face of the carrier web, e.g., by embossing, by laser drilling, or by forming the carrier by replicating a negative master. Useful flexible carrier webs include self-sustaining plastic films and other types of flexible sheet material such as papers having plastic coatings.

When the pockets are dimples and the novel tape is to be used to interconnect closely spaced electrodes, each dimple can be less than 0.1 mm in maximum breadth. In preferred adhesive tapes of the invention, the dimples are no greater than 0.05 mm in maximum breadth and are in an orderly pattern, such as a square or hexagonal array, having a center-to-center spacing no greater than 0.1 mm. The adhesive layer of that preferred adhesive tape can interconnect two facing arrays of electrodes having a lateral spacing as small as 0.1 mm without danger of short circuiting.

The pockets can be formed in the carrier web, or in the adhesive layer, or in both the carrier web and the adhesive layer. Because the size and spacing of the pockets can be controlled to ensure good electrical interconnections, the particles can be used in such small amounts that they do not detract from the bonding capability of the adhesive.

After depositing electrically conductive particles into pockets formed in the carrier web and applying an adhesive layer, the adhesive layer can be pressed against one of a pair of arrays of electrodes. In doing so, the pockets keep substantially all of the particles in place, even when heat and pressure are applied to cause the adhesive to soften and flow laterally. After removing the carrier web, the exposed face of the adhesive layer can be pressed against the other array of electrodes. In doing so, the electrodes of the second array contact the particles before they contact the adhesive, so that the particles can be gripped between the facing electrode arrays before being subjected to lateral forces created by the pressing action. When the particles are so gripped, the flowing adhesive displaces few particles so that the proportion of particles in the adhesive layer directly between two facing electrodes can exceed its proportion in lateral spaces into which it has flowed. This affords the economy of reducing the number of unused particles.

If desired, pockets can be formed only in areas of the carrier web that correspond to electrodes to be interconnected, thus effecting a further reduction in the number of unused particles. Within each of those areas, the pockets can be arranged in any desired pattern. When the dimples are in an orderly array extending over the full adhesive layer, there is no need to orient the adhesive layer with respect to arrays of electrode pairs.

For some uses of the novel tape, the electrically conductive particles in each pocket should be bound together by a binder, the proportion and properties of which are selected according to uses to which the novel tape is to be put. When the pockets are dimples, a binder can bind the particles into permanently coherent clusters; and when the pockets are elongated grooves, the binder can bind the particles into permanently coherent stripes. When each cluster or stripe is to be electrically conductive, the proportion of binder should be restricted to an amount that allows the particles to touch each other. This can usually be achieved when the binder provides from 1 to 50% by volume of total particles and binder and the particles are substantially spherical.

For some uses, a binder is employed to preserve the clusters or stripes only until the novel adhesive tape is used to interconnect two surfaces. For example, when the adhesive layer softens and flows under conditions used to interconnect two facing arrays of electrodes, the clusters or stripes can disintegrate, because the electrodes can be brought sufficiently close together to allow individual particles to provide the electrical connections, especially when the electrodes are raised. For such use, the particles preferably are of substantially uniform size.

By selecting a binder that forms a strong bond to electrically conductive surfaces to which the novel tape is to be bonded, the binder can supplement the bond created by the adhesive of the adhesive layer, thus improving resistance to adhesive failures under adverse conditions such as can be encountered in automotive and aerospace applications.

The binder preferably is organic. Useful organic binders include rubber latices such as of styrene-butadiene and butadiene-acrylonitrile copolymers, thermosetting resins such as epoxy resins and cyanate esters, and thermoplastic resins such as phenoxys, polysulfones, polyether sulfones, and polyvinylacetal resins. Preferred binders include mixtures of thermosetting and thermoplastic resins such as disclosed in coassigned U.S. Pat. No. 4,769,399 (Schenz) which is incorporated herein by reference. Inorganic binders that should be useful include bentonite, colloidal silica, and sodium silicate (water glass).

The binder can be identical to or different from the adhesive of the adhesive layer. When they are different, the binder can be selected for toughness and resiliency to maintain electrical contact between two electronic devices in spite of tensile and shear forces such as can be produced by vibrations and changes in temperature and humidity. Desirably, the adhesive layer shrinks slightly when a bond is formed between two substrates in order to apply compressive forces against the conductive particles. When the binder is selected to keep the particles in permanently coherent clusters or stripes, it preferably is selected to withstand stresses such as from thermal and mechanical phenomena. For example, the binder can be a thermoplastic polymer while the adhesive can be a thermosetting adhesive that can be cured while two electronic devices are being interconnected. Instead, the binder can be thermosetting and the adhesive thermoplastic, or both can be either thermosetting or thermoplastic or mixtures of thermosetting and thermoplastic resins.

When the adhesive layer is a pressure-sensitive adhesive, it may be necessary to employ a binder, the proportion and properties of which are selected to keep each cluster or stripe permanently intact. To do so may require curing of the binder.

A pressure-sensitive adhesive makes the novel tape convenient to apply without any need for heat. A preferred class of pressure-sensitive adhesives consists of the acrylate copolymers of coassigned U.S. Pat. No. Re. 24,906 (Ulrich). Also preferred are siloxane pressure-sensitive adhesives such as poly(dimethylsiloxane) pressure-sensitive adhesive (Dow Corning DC 284) and a phenyl-containing siloxane pressure-sensitive adhesive (GE 6574). A useful adhesive that becomes pressure-sensitive at elevated temperatures is disclosed in coassigned U.S. Pat. No. 4,880,683 (Stow) which is incorporated herein by reference.

THE DRAWING

In the drawing, each figure of which is schematic,

Figure 9:
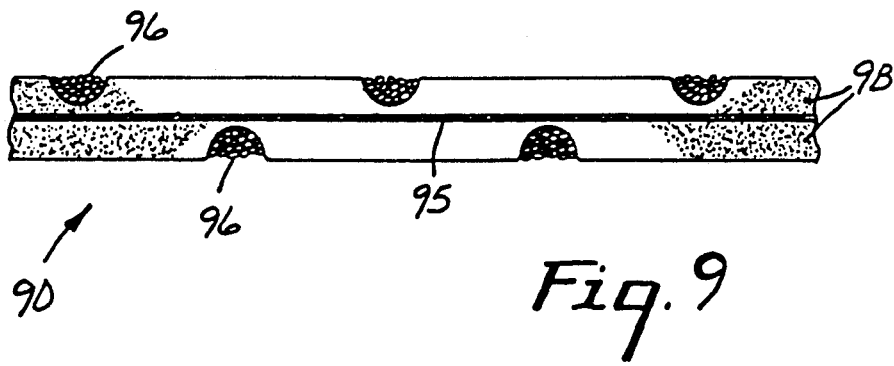
Figure 10:
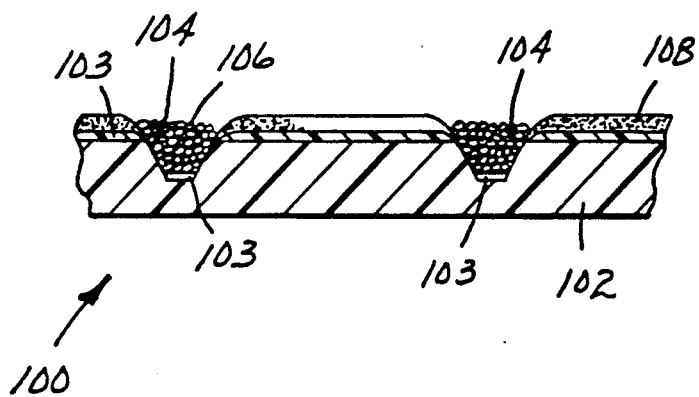
Figure 11:
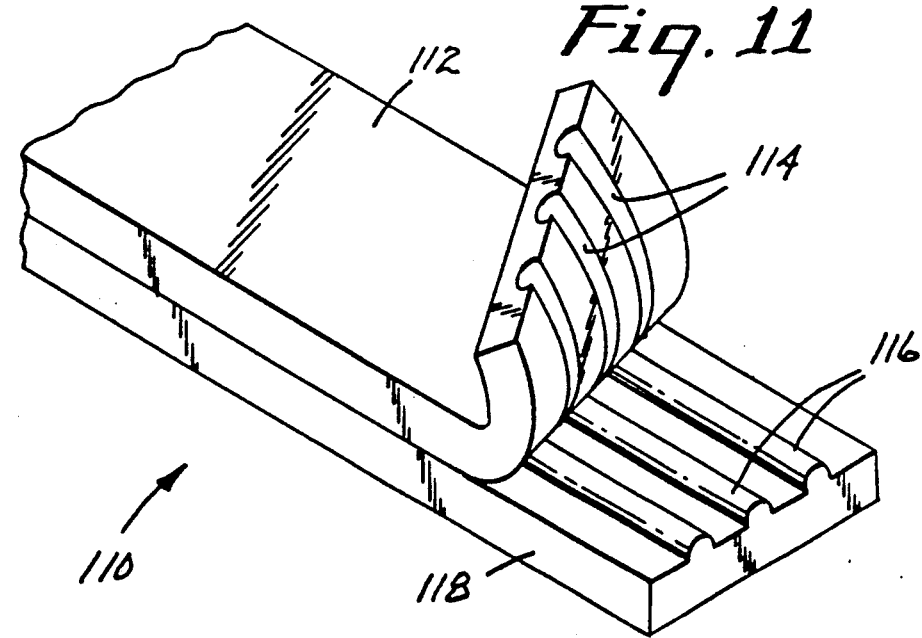

Each of FIGS. 6-10 is a cross section through an electrically conductive adhesive tape of the invention; and FIG. 11 is a perspective view of an electrically conductive adhesive tape of the invention.

DESCRIPTION OF THE PREFERRED EMBODIMENTS

Figure 1:
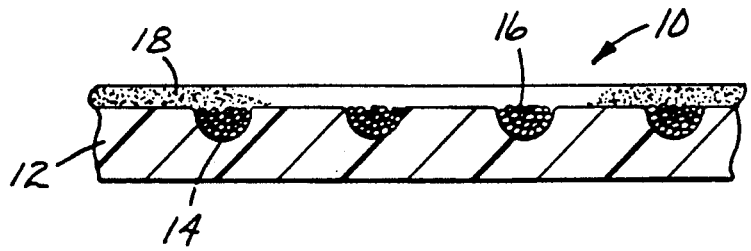
FIG. 1 is a cross section through an electrically conductive adhesive tape of the invention.

The electrically conductive adhesive tape 10 of FIG. 1 includes a flexible, disposable carrier web 12, a low-adhesion face of which has a plurality of dimples 14. Each of the dimples is filled with electrically conductive particles that are bound into clusters 16 by a binder (not shown) Covering the low-adhesion face and clusters is an adhesive layer 18.

Figure 2:
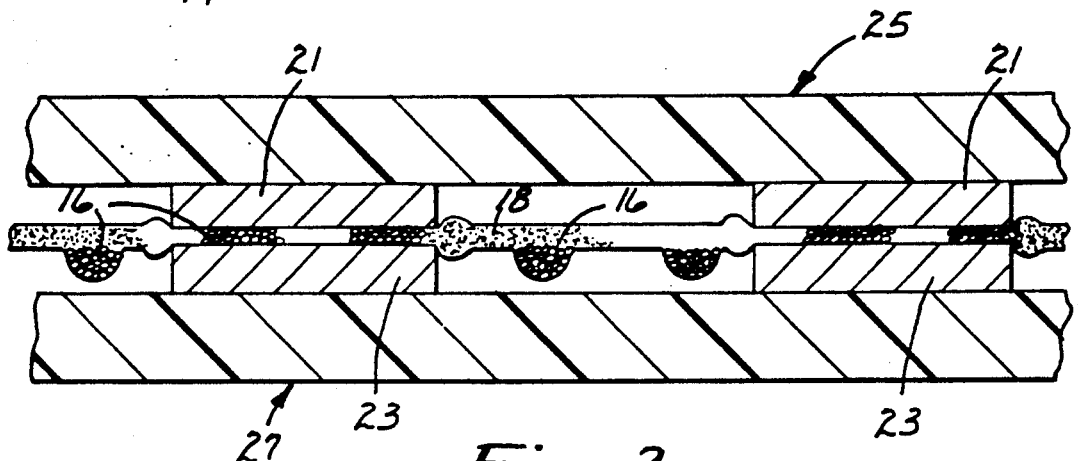
FIG. 2 is a cross section through an assembly of pair of electrical devices wherein the electrically conductive adhesive tape of FIG. 1 interconnects conductive elements.

FIG. 2 illustrates the use of the adhesive tape 10 of FIG. 1 to interconnect facing electrodes 21 and 23 of first and second electrical devices 25 and 27, respectively. After placing the exposed face of the adhesive layer 18 against the first electrical device 25, the carrier web 12 is removed, and the second electrical device 27 is laid against the newly exposed face of the adhesive layer. Sufficient pressure is applied to force the clusters 16 through the adhesive layer into contact with the electrodes 21 of the first electrical device 25, thus adhesively bonding the electrical devices 25 and 27 together while electrically interconnecting each facing pair of electrodes 21 and 23.

By making the adhesive layer 18 continuous and void-free between each pair of electrodes 21 and 23, the adhesive seals both the electrode arrays and the electrically conductive particles against moisture and other elements.

Figure 3:
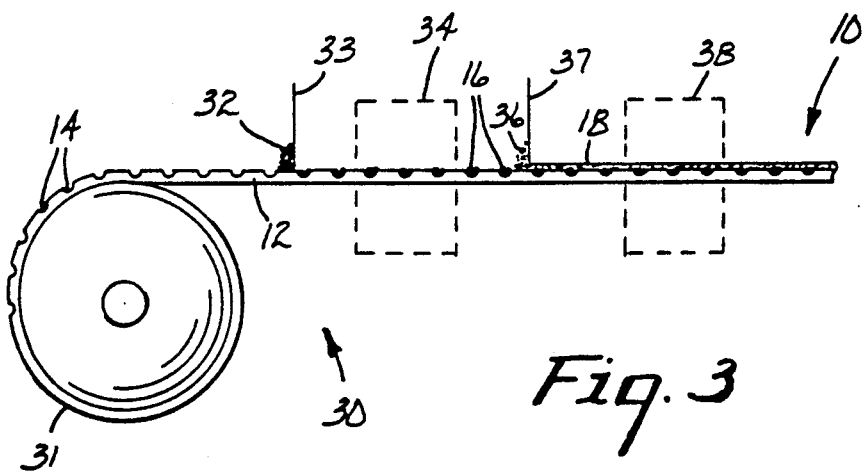
FIG. 3 is a plan view of apparatus that can be used to make the electrically conductive adhesive tape of FIG. 1.

The tape-making apparatus 30 of FIG. 3 employs a flexible carrier web 12 having a low-adhesion face which, after being embossed to form a plurality of dimples 14, was wound into a roll 31. A slurry 32 of electrically conductive particles and binder is coated onto the low-adhesion face, and a knife 33 scrapes the low-adhesion face clean, leaving the slurry substantially only in the dimples. After curing the binder in an oven 34 to bind the particles into clusters 16, a dispersion or solution of adhesive 36 is coated with a knife 37 over the low-adhesion face and clusters. This is dried in a second oven 38 to provide the adhesive layer 18 of the tape 10 of FIG. 1.

Another method of making an electrically conductive adhesive tape like that of FIG. 1 is to form perforations (e.g., using a laser) that extend completely through a flexible low-adhesion substrate such as polyethylene film. Then after bonding that substrate to a flexible web, each of the perforations is filled with a slurry of electrically conductive particles and binder, after which the slurry is dried to leave clusters. Onto the exposed face of the substrate is applied an adhesive layer which adheres strongly to the clusters but not to the substrate. Removal of the flexible web and substrate transfers the clusters to the adhesive layer, leaving an electrically conductive adhesive layer that is virtually indistinguishable from the particle-bearing adhesive layer of the tape 10 of FIG. 1.

Figure 4:
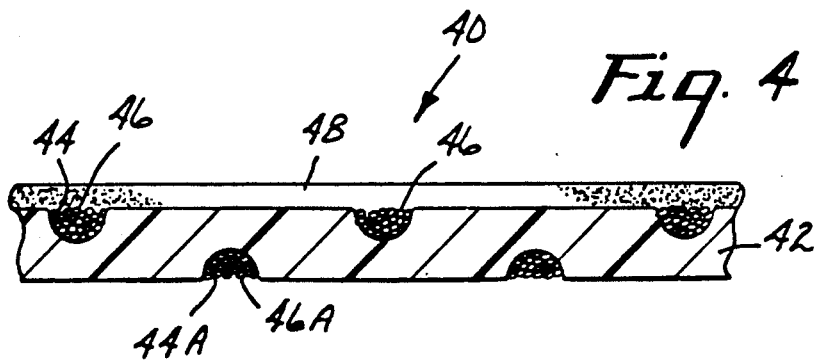
FIG. 4 is a cross section through an electrically conductive adhesive tape of the invention.

FIG. 4 shows a second electrically conductive adhesive tape 40 which includes a flexible, disposable carrier web 42, both faces of which are low-adhesion. Formed in one face are a plurality of dimples 44 and, in the other face, dimples 44A that are offset from the dimples 44. Each of the dimples 44 and 44A is filled with electrically conductive particles that are bound into clusters 46 and 46A, respectively, by a binder (not shown). Covering the clusters 46 is an adhesive layer 48. When the adhesive tape 40 is wound upon itself into a roll and later unwound, the clusters 46A on the exposed face of the carrier web are transferred to the adhesive layer 48.

By placing two sheets of the electrically conductive adhesive tape 10 of FIG. 1 with their exposed faces in contact and their clusters 14 laterally offset, a composite adhesive tape can be produced that is identical in appearance and function to the unwound adhesive tape 40 of FIG. 4, except having two disposable carrier webs instead of one.

Figure 5:
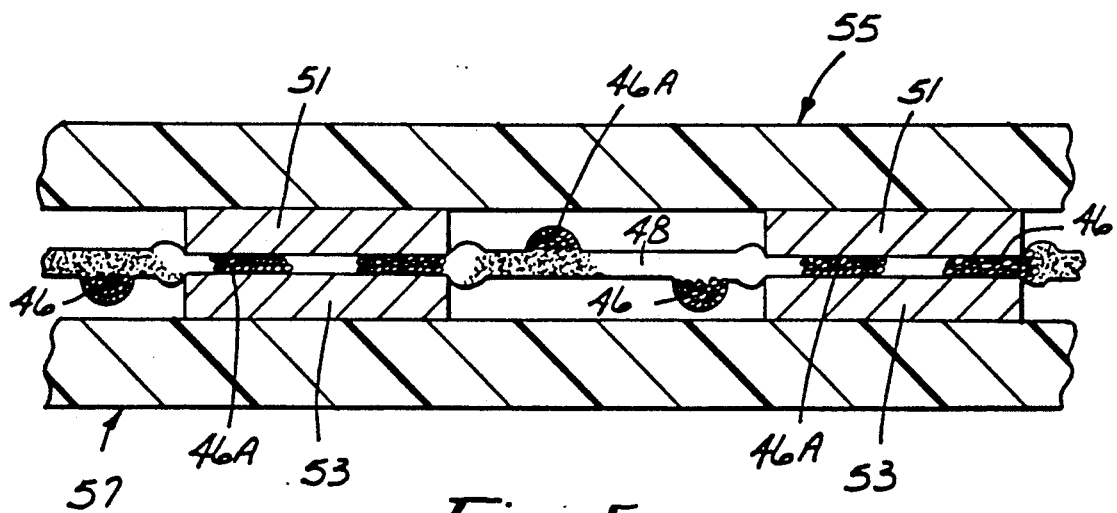
FIG. 5 is a cross section through an assembly of a pair of electrical devices wherein the electrically conductive adhesive tape of FIG. 4 interconnects conductive elements.

FIG. 5 shows the use of the adhesive layer 48 after being unwound and stripped from the carrier web 42 to interconnect facing electrodes 51 and 53 of a pair of electrical devices 55 and 57, respectively. While the exposed face of the adhesive layer 48 is lying on the electrical device 55, sufficient heat and pressure is applied to allow those clusters 46A that contact the electrodes 51 to be pressed into the softened adhesive. The carrier web 42 is then removed to expose the other face of the adhesive layer against which the other electrical device 57 is laid. Sufficient heat and pressure are then applied to force the clusters 46 into the adhesive and to compress the clusters 46 and 46A while allowing some of the adhesive to flow laterally into spaces between the electrodes 51 and 53. The lateral flow of the adhesive results in a higher particle-to-adhesive ratio between facing electrodes than in spaces lateral to the electrodes.

Figure 6:
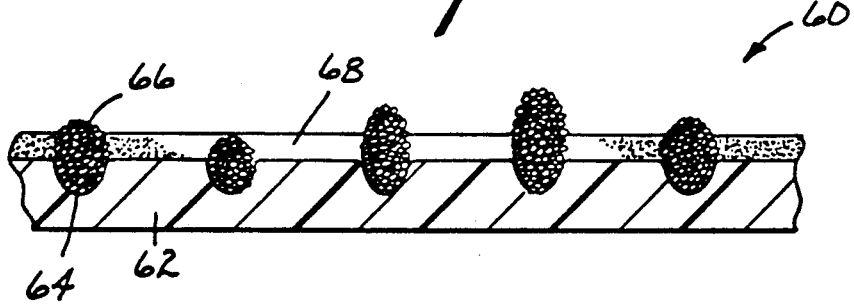

In FIG. 6, an electrically conductive adhesive tape 60 of the invention includes a flexible carrier web 62, a low-adhesion face of which is formed with a plurality of dimples 64. The tape 60 can be made by filling each of the dimples with a slurry of electrically conductive particles plus a binder and an expanding agent, expanding the slurry to form low-density clusters 66 that may or may not be electrically conductive, and then applying a layer of adhesive 68. Alternatively, the layer of adhesive 68 can be applied before expanding the slurry. After laying the exposed face of the adhesive layer against one of a pair of electrical devices that have matching arrays of electrodes and then peeling off the carrier web, the other of the electrical devices is laid against the newly exposed adhesive surface while applying pressure. The pressure collapses each of the clusters that is located between facing electrodes until each cluster becomes electrically conductive, if it was not already electrically conductive.

When heat is applied while applying pressure to the layer of adhesive 68 and its low-density clusters 66 and the heat causes the adhesive to soften and flow, the pressure can cause the softened adhesive to flow laterally until single particles of each cluster electrically interconnect the electrodes. When arrays of electrodes protude from two flat surfaces to be interconnected, only those low-density clusters that are contacted by the electrodes may be collapsed, thus leaving the other clusters in their low-density form. When the uncollapsed clusters are nonconductive, this provides better assurance against short circuiting.

A preferred expanding agent is provided by expandable microspheres available as EXPANCEL TM 551DU from Nobel Industries, Sundsvall, Sweden, and having a shell consisting basically of a copolymer of vinylidene chloride and acrylonitrile, which shell encapsulates a blowing agent (liquid isobutane) under pressure.

Figure 7:
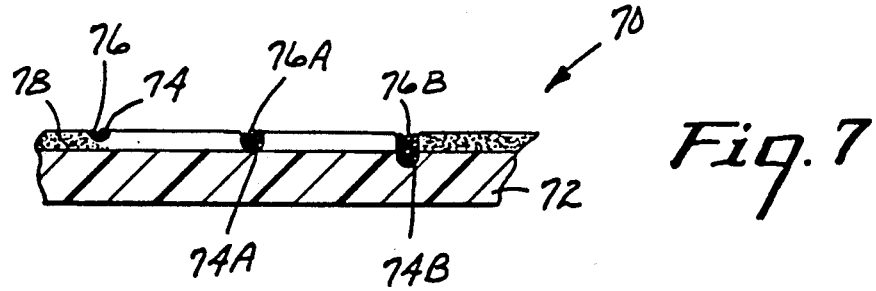

To make the electrically conductive adhesive tape 70 of FIG. 7, a nontacky heat-activable adhesive layer 78 has been applied to a smooth low-adhesion face of a carrier web 72. The surface of the adhesive layer has been embossed with a plurality of dimples, three of which are shown. One dimple 74 extends part way into the adhesive, a second 74A extends completely through the adhesive layer and to the surface of the underlying carrier web, and a third 74B extends through the adhesive layer and into the underlying carrier web. (Preferably, all dimples are the same size, but three sizes are shown to illustrate suitable sizes.) Each of the dimples 74, 74A and 74B has been filled with a slurry of electrically conductive particles and a binder that has been dried to form clusters 76, 76A and 76B, respectively. Upon being separated from the carrier web, the cluster-bearing adhesive layer can be used to interconnect conductive elements.

When the clusters (like the cluster 76) are smaller than the thickness of the adhesive layer, the adhesive should soften and flow in order to flow laterally under heat and pressure applied in making the interconnection. When the clusters (like the cluster 76A) are equal in size to the thickness of the adhesive layer and are electrically conductive, the adhesive can be pressure-sensitive, because electrical connections can be made as soon as the adhesive bonds two electrically conductive devices together. When the clusters (like the cluster 76B) are larger than the thickness of the adhesive layer, the clusters should be compressible or collapse and need not be electrically conductive until doing so.

When a nontacky adhesive is used to make the novel tape and coherent clusters or stripes of electrically conductive particles and binder have been formed in pockets in the nontacky adhesive layer, the adhesive layer either can be wound up with a liner or wound upon itself without a liner for convenient storage and shipment.

Figure 8:
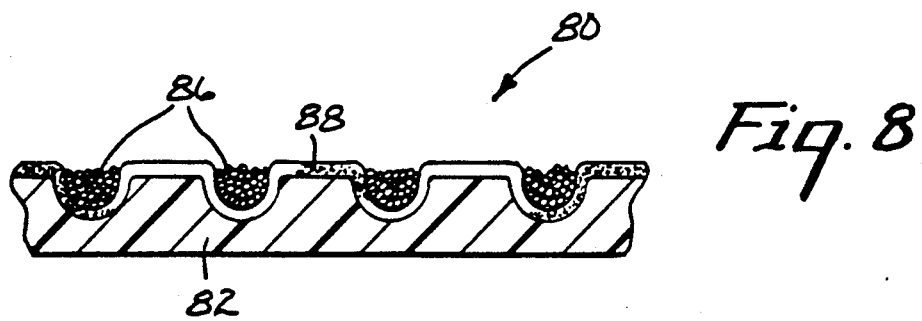

The electrically conductive adhesive tape 80 of FIG. 8 has a carrier web 82 having a smooth low-adhesion face that has been embossed with a plurality of dimples. Over this has been applied a relatively thin, nontacky adhesive layer 88 to leave the dimples, each of which has been filled with a slurry of electrically conductive particles 86. Alternatively, the illustrated dimples could have been formed after applying the adhesive layer.

The electrically conductive adhesive tape 90 of FIG. 9 consists of a nontacky adhesive layer 98, each face of which is formed with a plurality of the dimples, each of which has been filled with a cluster 96 of electrically conductive particles and binder. At the center of the adhesive layer is a reinforcing scrim 95 through which the particles can pass. When the adhesive tape 90 is squeezed between two electrically conductive surfaces having raised electrodes, the clusters are forced through the scrim to electrically interconnect facing electrodes.

To make the electrically conductive adhesive tape 100 of FIG. 10, a carrier web 102 has been coated with a thin silicone layer 103 and then embossed to form dimples 104. Each of the dimples has been filled with a slurry of electrically conductive particles including a binder that has been dried to form clusters 106. Then, the cluster-bearing face of the carrier web has been dusted with an adhesive powder that has adhered to the silicone layer 103 and not to the clusters 106, and the powder has been fused to form an adhesive layer 108 that has an opening at each cluster and may or may not be continuous in the areas between clusters. When the exposed face of the adhesive layer 108 is laid on a substantially flat surface of an electrical device and then heated and pressed against that surface, the clusters 106 contact the substantially flat surface without intervening adhesive, thus ensuring good electrical contact to conductive elements on the substantially flat surface. Then the carrier web 102 is stripped off to expose the other face of the adhesive layer 108, and a second electrical device is adhered to that exposed face.

In FIG. 11, an electrically conductive adhesive tape 110 of the invention has a flexible carrier web 112, a low-adhesion face of which is formed with a plurality of parallel grooves 114, each extending the length of the tape. Each of the grooves has been filled with a slurry of electrically conductive particles and binder that has dried to leave an electrically conductive elongated cluster or stripe 116. Over this has been applied an adhesive layer 118 to which the elongated clusters are being transferred by stripping off the carrier web 112.

The stripes of a piece of cluster-bearing adhesive layer 118 can be used to provide electrical connections between two arrays of electrodes that cannot be superimposed (as in the above-cited King patent).

An adhesive layer having electrically conductive stripes can be used to ground and to dissipate heat and/or static electricity from one electrically conductive surface to another. When the adhesive layer does not additionally afford discrete electrical connections, the stripes can intersect.

A variety of electrically conductive particles can be used in the novel tape, including metal such as silver or nickel, metal-coated polymeric particles, and graphite. When the electrically conductive particles are soft, as in the above-cited Reylek patent, moderate hand pressure applied while interconnecting facing arrays of electrodes can flatten the particles to provide a small, flat conductive area where each particle contacts an electrode or another particle. When they are hard as in the above-cited Calhoun patent application, the particles can penetrate into softer electrodes.

In the following examples, all parts are by weight.

EXAMPLE 1

This example reports the preparation of an adhesive tape bearing clusters of 2 $\mu$m nickel powder and a binder. The same heat-activatable adhesive was used both for the adhesive layer and the binder, namely a solution of the adhesive of No. 5300 adhesive film from 3M Co.

A 0.18 mm silicone-coated polypropylene release film was embossed to have 16 dimples per cm in a square lattice array. Each dimple was an inverted truncated cone having diameters of 0.18 mm at the surface and 0.10 mm at its depth of 0.064 mm. The embossed face of the release film was flooded with a slurry of 32 parts of the nickel powder, 8 parts of the binder, and sufficient tetrahydrofuran (THF) to adjust the viscosity to about 500 cps. After wiping with a doctor blade, the slurry in the dimples was allowed to dry at room temperature to form clusters. The embossed face of the release film was then coated with a solution of the same binder in THF which dried to a curable heat-activatable adhesive having a thickness of about 50 $\mu$m, thus producing a first electrically conductive adhesive tape of the invention.

The tape was cut into strips that were used to interconnect two circuit boards of 0.5 mm leads, 1 mm in pitch and 34 $\mu$m in height. The adhesive layer was removed from the release film and placed on one set of leads. The matching set was aligned by eye and clamped to apply pressure across the bond area. The clamp and boards were oven heated to 120° C. for 15 min. The oven was shut off and allowed to cool overnight. When tested for electrical continuity with a volt-ohm meter, all conductor pairs were successfully connected, and there were no shorts between adjacent conductors.

EXAMPLE 2

A second electrically conductive adhesive tape of the invention was made using a first mixture of 20 g of phenolic prepolymer of 75% solids with ethylene glycol ether solvent, 1 g of expandable microspheres (EXPANCEL 551DU) and 10 g of $\pi$parts isopropanol/10 parts water. Two parts of the first mixture were combined with a second mixture of 4 parts of 15 $\mu$m nickel powder (nickel flake from Novamet, Wyckoff, N.J.) and one part of isopropanol to provide a slurry that was coated onto a piece of the embossed release film used in Example 1. After wiping with a doctor blade, the deposited slurry was dried for 5 minutes at room temperature. Then the release film was placed in an oven at 120° C. for ten minutes to expand the slurry to form low density clusters that protruded from the dimples. Over the low density clusters was knife coated a solution of acrylic pressure-sensitve adhesive of 48% solids in ethyl acetate, toluene and isopropanol. After air drying for 5 min., this was placed in an oven at 120° C. for 3 min. The coating was then exposed to UV A black light (30 watt, 46 cm) delivering approximately 320 mJ/cm$^2$ min for 3 min., thus producing said second tape.

A piece of the second tape was placed on cleaned (polished with 600 grit coated abrasive sheeting and cleaned with MEK) contacts of a printed circuit board. Then after removing the release film, a matching board was aligned by eye and pressed into place by hand pressure. A volt-ohm meter was used to confirm electrical continuity and absence of shorting.

EXAMPLE 3

A third electrically conductive adhesive tape of the invention was made as in Example 2 except that the silicone-coated release film was embossed to have 26 dimples per cm. A pressure-sensitive adhesive copolymer of isooctyl acrylate and acrylic acid (90:10, 25% solids in ethyl acetate and heptane) was coated over the expanded clumps and air dried for 1 hr. When a piece of this tape was used to join test boards as in Example 2, similar results of electrical continuity and absence of shorting were observed.

EXAMPLE 4

The heat-activatable adhesive of Example 1 was coated onto a biaxially oriented polypropylene film and dried to a thickness of 50 $\mu$m. The adhesive layer was thermally embossed to have 33 dimples per cm in a square lattice array. The shape of each dimple was a truncated cone with approximate diameters at top and bottom of 75 μm and 50 μm, respectively. The depth of each dimple was nearly through the thickness of the adhesive film. The dimples were filled with the conductive slurry of Example 1 to form clusters.

To test the utility of this tape for adhesively bonding two members while electically interconnecting individual electrodes, a piece of the tape was used to bond a flexible circuit to a printed circuit board. The flexible circuit was 75 μm polyimide ("Kapton" from E.I. duPont) with an array of 17 parallel copper traces (34 μm thick) at a pitch of 1 mm. The width of the copper traces and the spacing between them were both 0.5 mm. The printed circuit board had an identical array of copper traces.

First, the exposed adhesive face was laid on the printed circuit and bonded thereto at 980 kPa and 100° C. for 5 sec. The width of the bond was 1.5 mm. The carrier was removed from the adhesive, and the flexible circuit positioned so that the traces were in register with those on the circuit board. The flexible circuit was then bonded to the circuit board at 1,960 kPa and 180° C. for 20 sec.

Interconnection resistances were measured using a two-wire method. Each resistance measurement included the resistance of the copper traces on both the printed circuit board and the flexible circuit as well as the resistance of the two interconnections. The resistances of the copper traces varied from trace to trace and from board to board, and ranged in value from 180 to 250 mΩ. Total resistances cross each of 17 pairs of adhesive connections were measured and are presented in Table I.

A similar experiment was carried out but with embossed Comparative Adhesive Layer A that did not contain any conductive particles, electrical connection being accomplished because the heat and pressure were sufficient to result in direct contact between terminals of the printed circuit test boards and copper traces of the flexible circuit. Comparison test data in Table I shows that the tape of Example 4 provided electrical connections of lower resistance than did Comparative Adhesive Layer A.

TABLE I

| | (Resistance in ohms) | |
|---|---|---|
| Channel No. | Adhesive Layer of Example 4 | Comparative Adhesive Layer A |
| 1 | 0.094 | 0.097 |
| 2 | 0.092 | 0.098 |
| 3 | 0.093 | 0.104 |
| 4 | 0.091 | 0.124 |
| 5 | 0.090 | 0.110 |
| 6 | 0.090 | 0.256 |
| 7 | 0.088 | 0.230 |
| 8 | 0.085 | 0.097 |
| 9 | 0.085 | 0.093 |
| 10 | 0.084 | 0.092 |
| 11 | 0.086 | 0.094 |
| 12 | 0.087 | 0.112 |
| 13 | 0.088 | 0.102 |
| 14 | 0.099 | 0.096 |
| 15 | 0.090 | 0.094 |
| 16 | 0.090 | 0.098 |
| 17 | 0.091 | 0.094 |

EXAMPLE 5

To the polyethylene face of a duplex film of 37 μm low-density polyethylene film and 75 μm biaxially oriented poly(ethylene terephalate) film was applied a silicone coating. The silicone-bearing face of the duplex film was embossed to have 98 dimples per cm arranged in a square lattice array to provide 9,604 dimples/cm$^2$. Each dimple was a truncated pyramid having a square bottom (about 37 μm on a side), a square top (about 47 μm on a side), and a depth of about 37 μm.

Each of these dimples was filled with a slurry consisting of nickel powder, "Kraton" elastomer (G-1650 from Shell) and cyclohexane. The nickel powder was INCO Type 123 from International Nickel, which has an average Fisher subsieve size of 3 to 7 μm. The slurry had been made by dissolving 5 parts of the "Kraton" elastomer in cyclohexane and then adding 95 parts of the nickel powder. Hand spreads were made by flooding the embossed face with the slurry and using a rubber doctor blade to wipe the surface clean of slurry except in the dimples. After allowing the solvent to evolve at room temperature, the embossed face was overcoated with the adhesive of Example 1 which was allowed to dry at room temperature to a thickness of 42 μm.

To measure the interconnect stability and uniformity of the resulting tape, bonds were made between 1) a flexible circuit and a rigid printed circuit board and 2) the flexible circuit and ITO (indium tin oxide) coated glass. The flexible circuit was "KAPTON" polyimide (from E.I. duPont) having an array of 17 parallel copper traces 34 μm thick, 0.2 mm wide, and 0.4 mm center to center. Each trace was gold plated. The printed circuit board had an identical array. The ITO coating had a resistance of 20 ohms per square.

The exposed adhesive face of a strip of the tape of Example 5 was bonded to the flexible circuit using a hot plate at 120° C. while pushing on the unembossed side of the carrier film with a cotton swab. After cooling, the carrier was removed to expose the adhesive layer by which the flexible circuit was bonded either to the ITO coated glass or to the printed circuit board using the bonding conditions of Example 4.

After cooling to room temperature, the resistances were measured with a four-wire probe arrangement such that 15 of the 17 connections were measurable. These resistances are recorded in Table II for each of the 15 connections between the flexible circuit and the circuit board and between the flexible circuit and the ITO coated glass. The two bonded samples were then placed in a chamber and thermal cycled between minus 55° C. and 125° C. over a period of about 5 hours. After 66 hours and again after 256 hours, the samples were removed from the thermal cycle chamber and allowed to rest at room temperature for 1 hour before measuring the resistances of the connections, as reported in Table II. These tests show that the tape of Example 5 provided low and uniform resistance connections, and that these resistances remained low even after thermal cycling.

TABLE II

| | (Resistance in ohms) | | | | | |
|---|---|---|---|---|---|---|
| | Flex. Circuit/Circuit Bd. | | | Flex. Circuit/Glass | | |
| Channel No. | As Bonded | Thermal Cycled (Hrs.) | | As Bonded | Thermal Cycled (Hrs.) | |
| | | 66 | 256 | | 66 | 256 |
| 1 | 0.247 | 0.251 | 0.251 | 0.448 | 0.754 | 1.86 |
| 2 | 0.246 | 0.246 | 0.246 | 0.435 | 0.883 | 2.11 |
| 3 | 0.245 | 0.250 | 0.251 | 0.445 | 0.859 | 2.34 |
| 4 | 0.241 | 0.243 | 0.243 | 0.432 | 0.799 | 2.39 |
| 5 | 0.241 | 0.241 | 0.240 | 0.429 | 0.851 | 2.08 |
| 6 | 0.242 | 0.240 | 0.240 | 0.449 | 0.811 | 2.47 |

TABLE II-continued

| | (Resistance in ohms) | | | | | |
|---|---|---|---|---|---|---|
| | Flex. Circuit/Circuit Bd. | | | Flex. Circuit/Glass | | |
| Channel No. | As Bonded | Thermal Cycled (Hrs.) 66 | 256 | As Bonded | Thermal Cycled (Hrs.) 66 | 256 |
| 7 | 0.236 | 0.236 | 0.236 | 0.417 | 0.844 | 2.73 |
| 8 | 0.235 | 0.236 | 0.235 | 0.456 | 0.796 | 2.28 |
| 9 | 0.235 | 0.236 | 0.237 | 0.433 | 0.786 | 1.98 |
| 10 | 0.239 | 0.238 | 0.239 | 0.422 | 0.783 | 2.08 |
| 11 | 0.241 | 0.243 | 0.244 | 0.450 | 0.791 | 1.91 |
| 12 | 0.242 | 0.243 | 0.244 | 0.428 | 0.844 | 2.07 |
| 13 | 0.246 | 0.249 | 0.249 | 0.441 | 0.769 | 2.20 |
| 14 | 0.248 | 0.249 | 0.248 | 0.456 | 1.028 | 2.87 |
| 15 | 0.249 | 0.248 | 0.248 | 0.452 | 0.791 | 2.00 |

COMPARATIVE EXAMPLES 1A-5A

Particle-free adhesive tapes were made by coating each of the adhesives of Example 1-5 onto an unembossed silicone-coated polypropylene release film to a thickness of about 50 μm.

Lap Shear Values from aluminum (measured under ASTM D1002) of each of the adhesive tapes of Examples 1-5 and Comparative Examples 1A-5A are reported in Table III.

TABLE III

| Example | Lap Shear Value in MPa | Comparative Example | Lap Shear Value in MpA |
|---|---|---|---|
| 1 | 3.4 | 1A | 5.8 |
| 2 | 0.67 | 2A | 0.51 |
| 3 | 0.82 | 3A | 1.5 |
| 4 | 6.1 | 4A | 4.2 |
| 5 | 2.4 | 5A | 4.1 |

The differences in Lap Shear Values from aluminum between the tapes of Examples 1-5 and 1A-5A, respectively, are within experimental error. These data show that tapes of the invention can incorporate electrically conductive particles without significant reduction in Lap Shear Value.

Electrically conductive adhesive tape of the invention can be employed for a variety of uses where electrical and/or thermal connections are required, e.g., for attaching a semiconductor die or chip to an electrically and thermally conductive substrate. An adhesive layer of the novel tape that contains electrically conductive clusters or stripes can be used to join steel panels to form the housing of an electrical appliance, thus serving both as a structural adhesive and to provide electrically conductive paths by which the appliance can be grounded for user safety.

What is claimed is:

1. Electrically conductive adhesive tape comprising a flexible carrier web that has a low-adhesion face in which is formed a predetermined pattern of spaced dimples of substantially equal size, each having a maximum breadth of 0.1 mm and containing a plurality of electrically conductive particles that are bound into a coherent cluster by a binder, and a layer of adhesive that contacts said clusters has a substantially uniform thickness and is substantially free from electrically conductive material other than said clusters, which adhesive layer can be separated from the carrier web, carrying with it the particle clusters, and then used for adhesively bonding two substantially flat electrically conductive surfaces, with particles of individual clusters bridging the adhesive layer to afford electrical interconnections between those surfaces.

2. Electrically conductive adhesive tape as defined in claim 1 wherein the maximum breadth of each dimple is no greater than 0.05 mm and the dimples are in a predetermined array.

3. Electrically conductive adhesive tape as defined in claim 2 wherein the dimples are in a square or hexagonal array and have a center-to-center spacing no greater than 0.1 mm.

4. Electrically conductive adhesive tape as defined in claim 1 wherein each dimple is elongated.

5. Electrically conductive adhesive tape as defined in claim 4 wherein each elongated dimple crosses a plurality of other dimples.

6. 8. Electrically conductive adhesive tape as defined in claim 1 wherein the adhesive of said adhesive layer is a pressure-sensitive adhesive.

7. Electrically conductive adhesive tape as defined in claim 1 wherein the adhesive of said adhesive layer softens and flows at bonding temperatures.

8. Electrically conductive adhesive tape as defined in claim 1 wherein the binder is an adhesive selected to supplement the bond of the adhesive layer to a substrate.

9. Electrically conductive adhesive tape as defined in claim 8 wherein the adhesive of the adhesive layer comprises a thermosetting polymer, and the binder comprises a thermoplastic polymer.

10. Electrically conductive adhesive tape as defined in claim 1 wherein the binder provides from 1 to 50% by volume of total particles and binder in each pocket.

11. Electrically conductive adhesive tape as defined in claim 1 and having an expanding agent admixed with said binder.

12. Electrically conductive adhesive tape as defined in claim 1 wherein said dimples are formed in said low-adhesion face of the carrier web, and the adhesive layer covers the electrically conductive particles.

13. Electrically conductive adhesive tape as defined in claim 1 wherein both faces of the carrier web are los-adhesion, and the adhesive layer and carrier web are wound up together in roll form for convenient storage and shipment.

* * * * *

UNITED STATES PATENT AND TRADEMARK OFFICE
CERTIFICATE OF CORRECTION

PATENT NO.  :  5,087,494

DATED  :  February 11, 1992

INVENTOR(S)  :  Calhoun, Berg, Koskenmaki, Swinehart

It is certified that error appears in the above-identified patent and that said Letters Patent is hereby corrected as shown below:

Title page, Abstract, Line 1, "edhesive" change "e" to "a"-- should be "adhesive" --

Column 10, Line 25, "10 g of $\pi$ parts" change "$\pi$" to "90" -- should be "10 g of 90 parts" --

Column 14, Line 54, "los-adhesion" change "los" to "low" -- should be "low-adhesion" --

Signed and Sealed this

Thirtieth Day of April, 1996

Attest:

BRUCE LEHMAN

*Attesting Officer*  *Commissioner of Patents and Trademarks*